United States Patent [19]

Shirataki

[11] Patent Number: 4,668,329

[45] Date of Patent: May 26, 1987

[54] METHOD AND AN APPARATUS FOR APPLYING AN EMULSION ONTO A SCREEN-PRINTING PLATE

[75] Inventor: Kenji Shirataki, Tokyo, Japan

[73] Assignee: Tokai Shoji Co., Ltd., Tokyo, Japan

[21] Appl. No.: 699,454

[22] Filed: Feb. 7, 1985

[30] Foreign Application Priority Data

Mar. 8, 1984 [JP] Japan ................................. 59-44486

[51] Int. Cl.$^4$ ........................ B44C 1/00; B44C 1/16; B05C 3/02; 02G 3/00
[52] U.S. Cl. ................................... 156/540; 118/413; 156/237; 156/241; 156/575; 427/358
[58] Field of Search ............... 156/241, 230, 237, 384, 156/241, 356, 361, 540, 552, 575, 580, 584, 578, 236; 101/128.24; 118/213, 407, 413, 414, 406, 410; 427/358, 356

[56] References Cited

U.S. PATENT DOCUMENTS

| | | | |
|---|---|---|---|
| 1,080,990 | 12/1913 | Meyercord | 156/237 |
| 3,627,564 | 12/1974 | Mercier | 427/358 |
| 3,928,627 | 12/1975 | Mand et al. | 427/358 |
| 4,216,286 | 8/1980 | Greene et al. | 156/236 |
| 4,363,289 | 12/1982 | Gasser | 101/128.4 |
| 4,363,833 | 12/1982 | Blaak | 427/358 |

Primary Examiner—Donald E. Czaja
Assistant Examiner—Louis Falasco
Attorney, Agent, or Firm—Young & Thompson

[57] ABSTRACT

A method and an apparatus for applying an emulsion onto a screen-printing plate are disclosed, in which an emulsion film having thereon an applying emulsion of a predetermined thickness is prepared, which film is closely contacted with the screen-printing plate on its printing side for applying the emulsion thereon. Preferably, a penetrable agent is supplied for facilitating the release and adhesion of the applying emulsion.

3 Claims, 8 Drawing Figures

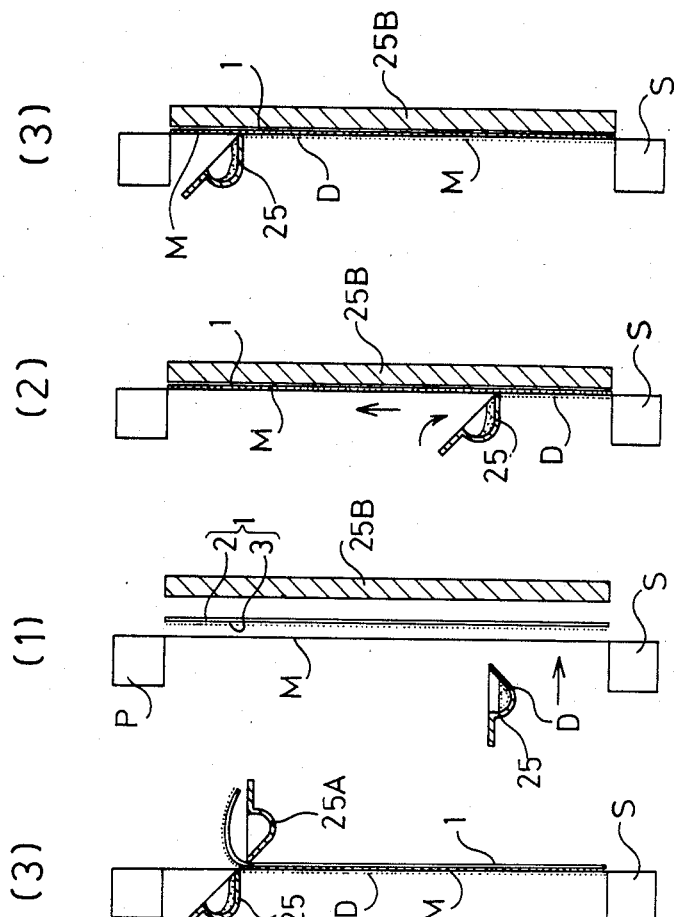
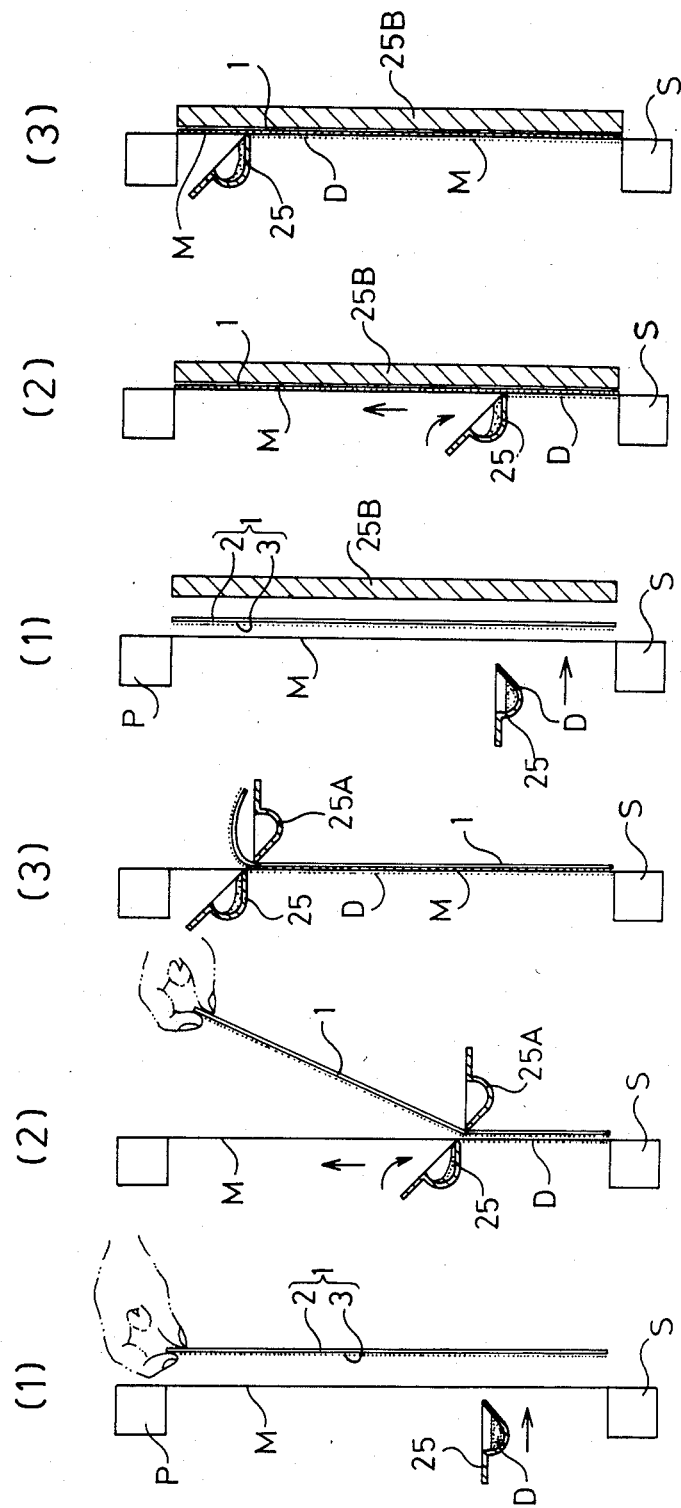

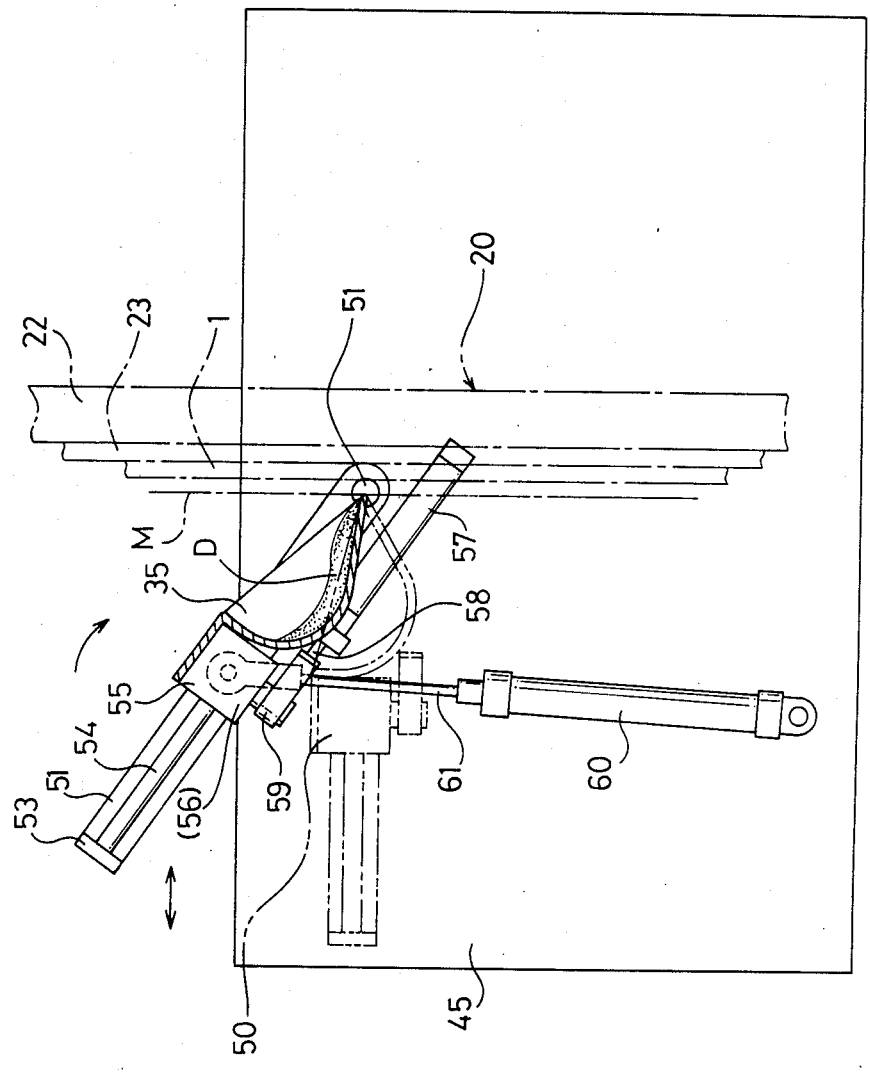

METHOD AND AN APPARATUS FOR APPLYING AN EMULSION ONTO A SCREEN-PRINTING PLATE

FIELD OF THE INVENTION

This invention relates to a method and an apparatus for applying an emulsion onto a screen-printing plate, wherein upon applying the emulsion of a photosensitive material onto the screen-printing plate an emulsion film coated with a predetermined thickness of the emulsion is utilized for achieving a uniform thickness of the emulsion over the entire surface of the screen on its printing side and sharp print lines on printings.

BACKGROUND OF THE INVENTION

Heretofore, the emulsion has been applied by vertically slidable squeegees of a bucket type contacted at their front edges with the screen consisting of a material such as silk, polyester, nylon or the like and having a given mesh size and a frame surrounding the material. In this case, the manual moving operation requires a particularly high skill in order to apply a film of a uniform thickness. In order to overcome the difficulty of the prior art, there have been proposed various types of mechanically moving squeegees, as disclosed in U.S. Pat. No. 4,363,289 (corres. to the Published European Patent Application No. 0026538). The U.S. Patent relates to a method and an apparatus for applying an emulsion onto a screen-printing plate in which squeegees arranged at either side of the screen are advanced toward the screen face so as to make contact therewith the screens are inclined to allow emulsion to flow out of the squeegees at their front edges. The squeegees, are vertically moved relative to the screen. The emulsion flows down naturally from the squeegees so that the emulsion may be scraped by the front edge of the squeegee upon its upward movement for providing a uniform film thickness, but upon its downward movement (necessary for thick application) the emulsion flows into the underside of the squeegee and is applied in different quantities thereby which results in an irregular thickness. In applying emulsion on both sides of the screen starting at a lower section, a certain distance between the screen face and the front edges of the squeegees is needed in order to provide a relatively thick emulsion film because the contacted squeegees may scrape off the applied emulsion. Thus, a screen with a greater thickness of the emulsion on its printing side can not be produced. Furthermore, the squeegees on both sides of the screen are symmetrically and synchronously moved with each other by a single cylinder, so that one of the squeegees must be replaced by either a rod or roller for single side application of the screen, thereby requiring a troublesome replacement and resulting in a very difficult switchover between the application on both sides to single side application or vice versa through continuous and automatic operation. Upon printing with the screen, the application of a thicker emulsion on the printing side rather than on the ink-applying side is essential for obtaining a beautiful print and presents a difficult which is present in the prior art as described hereinabove.

Furthermore, another method has hitherto been employed in which an applying film having layered thereon a predetermined thickness of an emulsion is releasably coated on a substrate to form an emulsion film. The emulsion film in turn is set horizontally under a screen face, and a suitable squeegee is used for manually coating the applying film on the screen face in order to release the emulsion and release it from the screen through the action of a penetrating agent, such as water. In this method, however, the manual movement of the squeegee provides nonuniform penetration of the agent into the whole area of the applying film so as to leave non-attached portions thereon after the operation, so that a skillful applying operation is required.

Accordingly, an object of the invention is to solve the problem in the prior method and apparatus and to provide a method and an apparatus capable of variably determining a thickness of an emulsion on a printing face of a screen by selecting a thickness of an applying film, an applying pressure of a squeegee for feeding a penetrating agent onto the applying film, a feeding rate of the penetrating agent, and a type of the penetrating agent, and further providing uniform and sharp lines upon printings.

SUMMARY OF THE INVENTION

In one aspect, the invention provides a method of applying an emulsion onto a screen printing plate supported vertically on a base.

The first step is to an emulsion film which comprises a substrate having a penetrable film emulsion with predetermined thickness releasably coated on one surface, The coated surface of the emulsion film is contacted with the printing side of a screen-printing plate.

The next step is to apply to the opposite side of the plate a penetrating agent by means of a squeegee which is vertically movable on the opposite side of said screen-printing plate. The opposite side is the inking side of the plate.

The penetrable film is adhered to the screen surface through penetrating action of the emulsion. Finally, the substrate is released from the emulsion and is removed.

In another aspect, the invention provides an apparatus for applying an emulsion onto a screen-printing plate. The apparatus comprises a base having opposite vertical side walls on either side for forming a frame and a supporting mechanism for supporting an emulsion film in contact with a supporting plate fixed vertically to the base and having clamps for urging the planar screen-printing plate against the emulsion film at its front face. The emulsion film comprises a substrate releasably coated with a predetermined thickness of a penetrable film of emulsion. The apparatus further comprises a lifting mechanism for vertically moving an applying element along the screen-printing plate on its front side. The said applying element holds a film penetrating material. An actuating mechanism is arranged at the front of the screen-printing plate for advancing the applying element toward the screen face during upward movement of the applying element, thereby to allow its front edge to be contacted with the screen face and to be inclined, and for restoring the applying element to its horizontal state upon downward movement when it is withdrawn from the screen face. A controlling mechanism controls the various movement of the applying element.

The invention will be described hereinbelow in more detail for the preferred embodiments with reference to the accompanying drawings.

BRIEF DESCRIPTION OF THE DRAWINGS

FIG. 1 is a schematic side view showing the applying operation according to the invention;

FIG. 2 is a schematic side view showing another embodiment of the applying operation according to the invention;

FIG. 5 is a vertical section of a main portion of the apparatus;

PREFERRED EMBODIMENTS OF THE INVENTION

Figure 4:
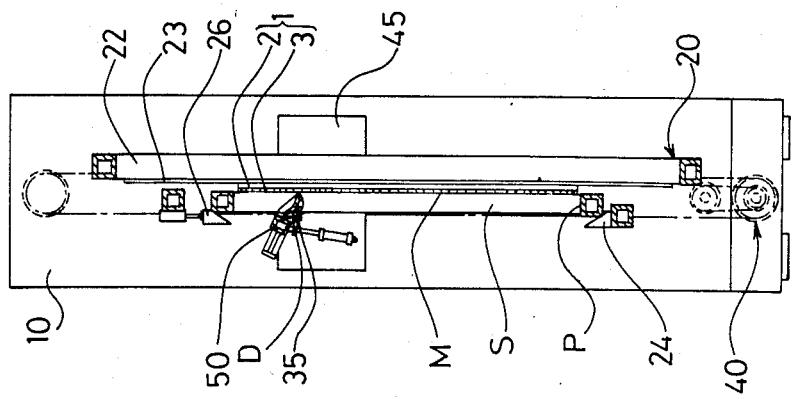
FIG. 4 is a vertical section of the apparatus of FIG. 3.

In FIGS. 1 and 2, an emulsion film 1 comprises a substrate 2 made of a plastic sheet which is releasably coated with a penetrable film 3 made of a photo-sensitive emulsion in a predetermined thickness corresponding to a thickness of an emulsion to be applied onto a screen-printing plate S. The plate S consists of a frame P around a screen material M made of silk, polyester, nylon or stainless steel and having a predetermined mesh size. The thickness may be on the order of 15, 20, 25, 30 in consideration of the amount to be incorporated into the screen material M.

The emulsion film 1 is contacted on its applying side, the side containing the film 3, with a printing side (or a printing surface) of the screen-printing plate S supported vertically. In such a position, a penetrating agent D is applied to the screen material M by a bucket squeegee 25 moving vertically along an inking side (or a squeegee side) of the screen-printing plate S. The penetrating action into the film 3 of the agent D causes the film to adhere to the screen surface. The penetrating agent D penetrates into the film 3 and causes it to dissolve and may be either water or a photosensitive emulsion or a combination thereof.

When the agent D is applied by the squeegee 25 onto the screen M, a predetermined pressure is kept on to the screen M, so as to provide enough supporting force to keep the emulsion film 1 in contact with the screen material M. For this purpose, the emulsion film 1 may be supported on its rear face (or substrate side) by a suitable supporting means.

One embodiment of the supporting means as shown in FIG. 1 is a supporting element 25A which is movable along the screen face synchroneously with the vertical movement of the squeegee 25. The supporting element 25A is located in a retreated position before the applying operation, but advances synchroneously with squeegee 25 for urging the emulsion film 1 onto the screen M (see FIG. 1 (2)) and for pouring the pentrable agent D by tilting the squeegee 25 (see FIGS. 1 (2) and (3)). In this case, the emulsion film 1 at its upper end is manually held either by the operator's fingers or other subsidiary supporting means. This type of supporting element has the advantage that identical squeegees may be utilized as elements 25 and 25A on either side of the screen-printing plate S and in that the screen-printing plate S may be positioned irrespective of its front or rear face.

Another embodiment of the supporting means as shown in FIG. 2 is a plate element 25B for holding the whole surface of the emulsion film 1 in contact with the screen M. The plate element 25B may be set by means of clamps 26 at the time when the screen-printing plate S is assembled, and may be a rectangular plate covered with a cloth. In this embodiment, the plate element 25B is secured to the rear side of the screen M in order to hold the emulsion film 1 in contact with the screen M prior to the squeegee operation (see FIG. 2 (1)). Then, the squeegee 25 is advanced and tilted while moving upwardly to pour the penetrable agent D (FIGS. 2 (2) and (3)). The plate element 25B has the advantage of improving the operability without need for the subsidiary supporting element as in the first embodiment.

After the applying film 3 of the emulsion film 1 is contacted with the screen M in this way, only the substrate 2 is released from the emulsion film 1 to leave the emulsion (namely, the applying film 3) of the predetermined thickness on the screen M.

The apparatus according to the invention for embodying the method as described hereinabove will be illustrated in detail with reference to FIGS. 3 to 8.

The apparatus according to the invention comprises a base 10 arranged on a suitable location, a supporting mechanism 20 for vertically supporting the screen-printing plate S while in contact with the emulsion film 1, an applying mechanism 40 for lifting an applying element 35 in front of the screen-printing plate S in order to provide the penetrable agent D, and a controlling mechanism 70 for adjusting the supply of the penetrable agent D by the applying element 35.

Figure 3:
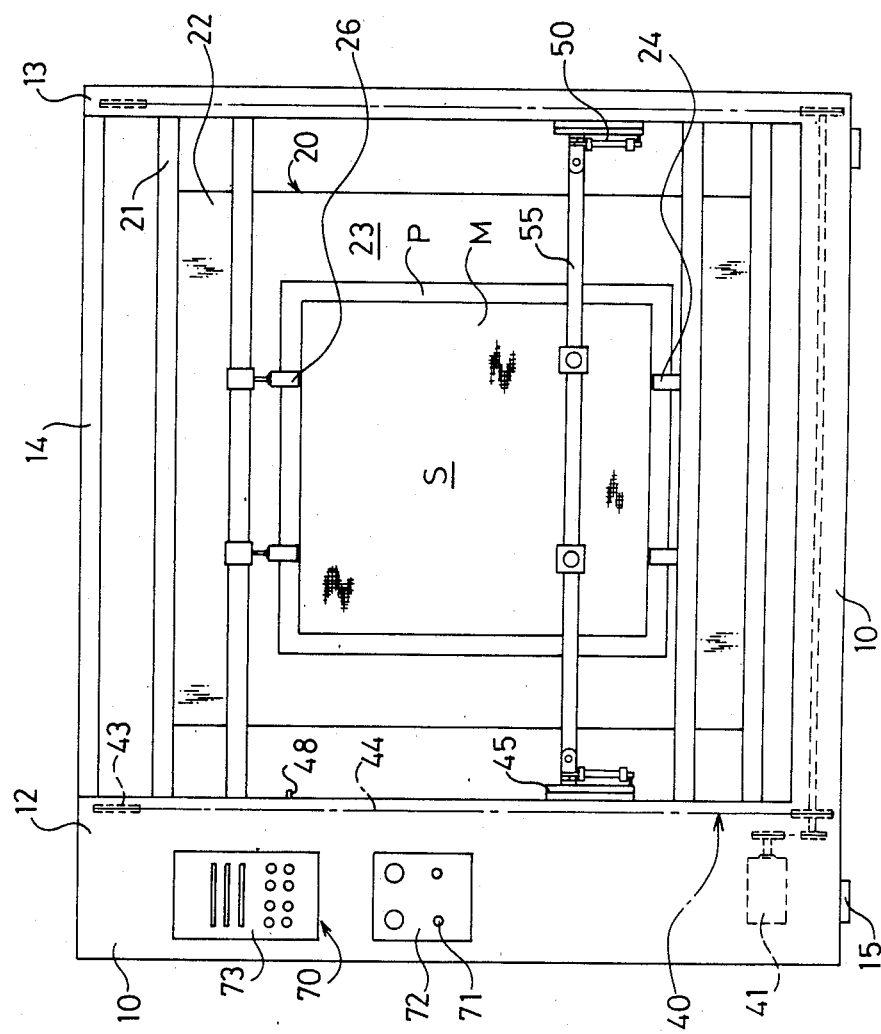
FIG. 3 is a plan view of the apparatus according to the invention.

As shown in FIG. 3, the base 10 is provided vertically with opposite walls 12, 13 which are adjusted horizontally by an adjuster 15 and provided with an upper wall 14 therebetween. In front of the wall 12 is arranged an operation panel 72, 73 as described hereinafter which is preset for the various factors of the controlling mechanism 70. In a lower space is received a motor 41 for driving the applying mechanism 40.

In an operational space between the walls 12 and 13 are arranged the supporting mechanism 20, the applying mechanism 40 and an operational mechanism 50, respectively for setting the screen-printing plate S with the emulsion film 1, and applying the penetrable agent D to form the applying film 3 on the screen material M.

As shown in FIGS. 3 and 4, the supporting mechanism 20 consists of a supporting plate 22 vertically secured to the base 10 between horizontal supporting bars 21 and of clamps 26 for holding and press-fixing the emulsion film 1 in contact against the screen-printing plate S. For this supporting purpose, the lower bar 21 is provided with clamping dies 24 which at their rear face are inclined as shown in FIG. 4, while a vertically slidable clamp-fixing bar is arranged in front of the supporting plate 22, which bar is provided with clamps 26 of a pneumatic cylinder type each having a grip with its rear face being inclined. Thus, the screen-printing plate S is set between the supporting plate 22 and the dies 24. Operation of the clamp 26 allows each inclined face of the dies 24 and the clamps 26 to urge the screen-printing plate S toward the supporting plate 22, thereby to hold the screen material M of the screen-printing plate S in contact with the emulsion film 1 on the supporting plate 22. Thus, a reliable setting may be achieved by this simple construction.

The supporting plate 22 on its front face is attached to an elastomeric mat 23 which may be made of rubber or other elastomers in sheet form with a predetermined thickness. When the mat 23 is contacted with the emulsion film 1, an electro-static action may support these elements at a required position without need for special subsidiary fixing means. When the penetrable agent D is supplied to the screen material M by the supplying element 35 for applying the emulsion 3 of the emulsion film 1 onto the screen material M, the element 35 urges the screen M with a required force and moves upwardly. In this case, an elastic action of the mat 23 imparts an adequate tension to the screen material M, thereby achieving a smooth movement of the element 35 along the screen face.

Figure 8:
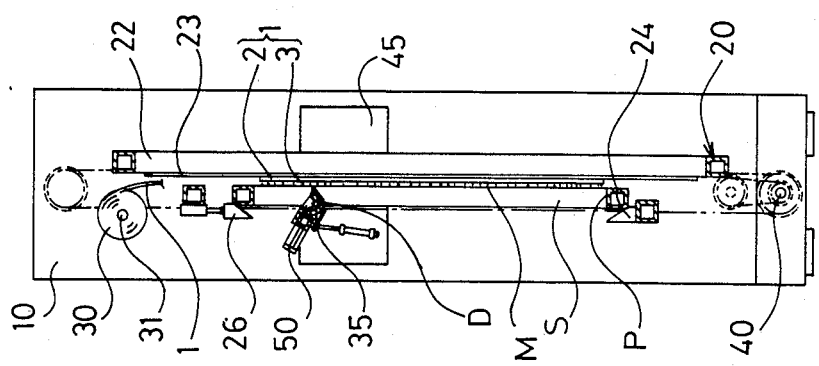
FIG. 8 is a vertical section of another embodiment of the apparatus according to the invention.

FIG. 8 shows another embodiment, in which a film feeding mechanism 30 is arranged for receiving a wound roll of the emulsion film 1 to be cut in a required length upon use. The film-supplying mechanism 30 consists of a feeding roller 31 arranged between the walls 12 and 13 for replaceably receiving the wound roll of the emulsion film 1. Thus, the emulsion film 1 may be fed continuously and used in any suitable length to improve the operability.

In such a contacted relation of the emulsion film 1 with the screen-printing plate S, the penetrable agent D is applied from the printing side of the plate S by the applying mechanism 40 and the operational mechanism 50.

Figure 6:
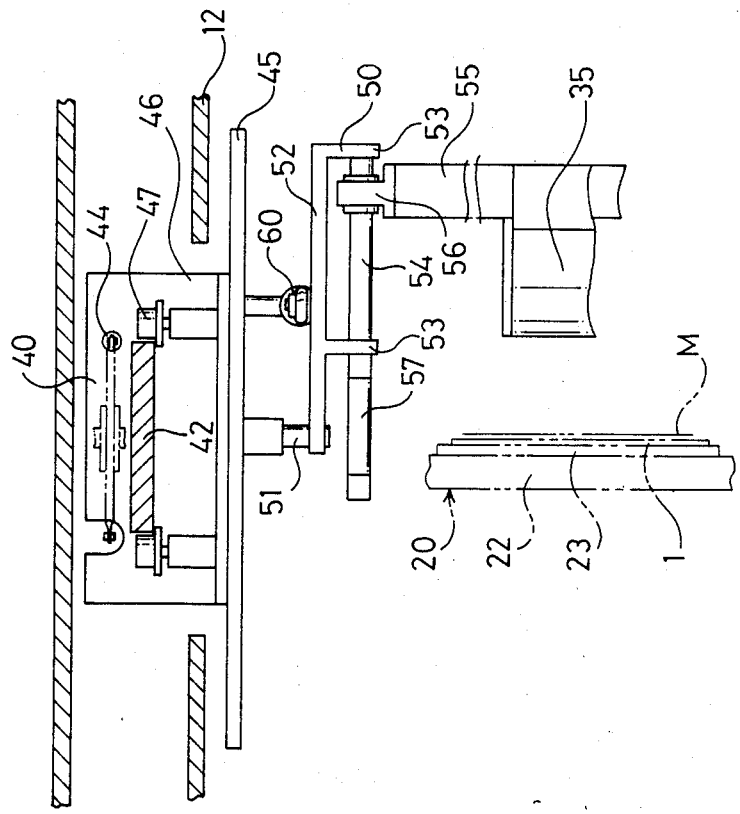
FIG. 6 is a cross-section of the main portion of the apparatus.

The applying mechanism 40 enables the supplying element 35 to move vertically along the screen face. More particularly, a supporting bar 55 removably supporting the supplying element 35 is arranged between opposite units 45 on the walls 12 and 13, each of which units is engaged with a chain 44 recycling in the respective wall 12, 13 and is moved vertically by means of a guide roller 47 along a guide 42. Above and below the guide 42 are arranged sprocket wheels 43 which are engaged with the chain 44. Thus, the chain 44 may be driven by the motor 41 for moving the unit 45. The moving range of the unit 45 may be adjusted for a distance between the upper and the lower ends of the screen-printing plate S on the supporting mechanism 20. Therefore, the corresponding positions of the walls 12, 13 are provided with adjustable upper and lower limiting switches 48, 48 for deenergizing the motor 41 when the switches contact with the unit 45. As shown in FIG. 6, the chain 44 behind the guide 42 is engaged with an engaging part 46 protruded behind the unit 45. The engaging part 46 is provided with a guide roller 47 in contact with a front edge of the guide 42, which roller is rotated along the guide 42 to vertically move the unit 45 smoothly in association with the chain 44 and thus to ensure a constant pressure and distance of the supplying element 35 in relation to the screen face. Preferably, a shock- or vibration-absorbing material may be inserted between the guide 42 and the guide roller 47.

The applying mechanism 50 permits the supplying element 35 to advance toward the screen face upon upward movement of the element 35 and to put its front edge in a contacted and inclined position, while the mechanism 50 permits the supplying element 35 to restore its horizontal position and to retreat from the screen face upon downward movement of the element 35.

More particularly, the applying mechanism 50 comprises tilting arms 52 swingably supported to the units 45 movable along the walls 12 and 13, between which arms 52 is arranged the supporting bar 55. The tilting arms 52 may be slided forward and backward by a slide shaft 54 attached thereto. The supporting bar 55 is connected to a piston 58 of a cylinder 57 fixed to the tilting arm 52, while the tilting arm 52 is connected to a piston 61 of a cylinder 60 supported to the unit 45.

As shown in the drawings, when the applying element 35 mounted to the supporting bar 55 applies the penetrable agent D, it advances toward the screen face to contact it its front edge with the screen face and tilts for pouring the penetrable agent D, which in turn passes through the screen mesh to penetrate the emulsion film 1. For this reason, the applying element 35 is desirably inclined with its front edge being fixed. In order to advance the applying element 35 rapidly and smoothly toward the screen face, the supporting bar 55 is arranged between the arms 52 for ensuring that the front edge is aligned with a supporting position of the arm 52 after completing the advancing movement. For this purpose, the applying element 35 is operated by serving a contacted point of the screen as a tilting center, while the supporting position of the tilting arm 52 is located on a supporting pin 51 in the unit 45.

As shown in FIGS. 5 and 6, the arm 52 is provided with a pair of supports 53, between which a slide shaft 54 is arranged. Under the front support 53 is horizontally arranged a cylinder 57, a piston 58 of which is extended in parallel to the slide shaft 54. A front end of the piston 58 is connected to a joint 59 provided under the supporting bar 55. Under the arm 52 is vertically arranged a cylinder 60 which is connected to the unit 45 and contains a piston which at its front end is connected to the arm 52. The supporting bar 55 is fitted to the slide shaft 54 through a ball bushing 56 formed at both end of the bar 55. Thus, the bar 55 is arranged between the arms 52 supported on the units 45. By using the ball bushing 56, the supporting bar 55 may be moved smoothly along the slide shaft 54 with less friction. Further, the long bar 55 may be prevented from deflecting which ensures stable operation.

The applying mechanism 50 thus constructed is operated by a controlling mechanism 70 as described hereinafter. When the unit 45 moves upward, the cylinder 57 is operated to advance the supporting bar 55 on the slide shaft 54 for urging the front edge of the applying element 35 against the screen face (see FIGS. 4 and 5). Then, the cylinder 60 is operated to tilt the arm 52 together with the applying element 35 for pouring the penetrable agent D onto the screen M. When the unit 45 moves downward, the cylinder 60 is operated to restore the arm 52 together with the applying element 35 to the horizontal position and then the cylinder 57 is operated to withdraw the supporting bar 55 with the applying element 35.

Figure 7:
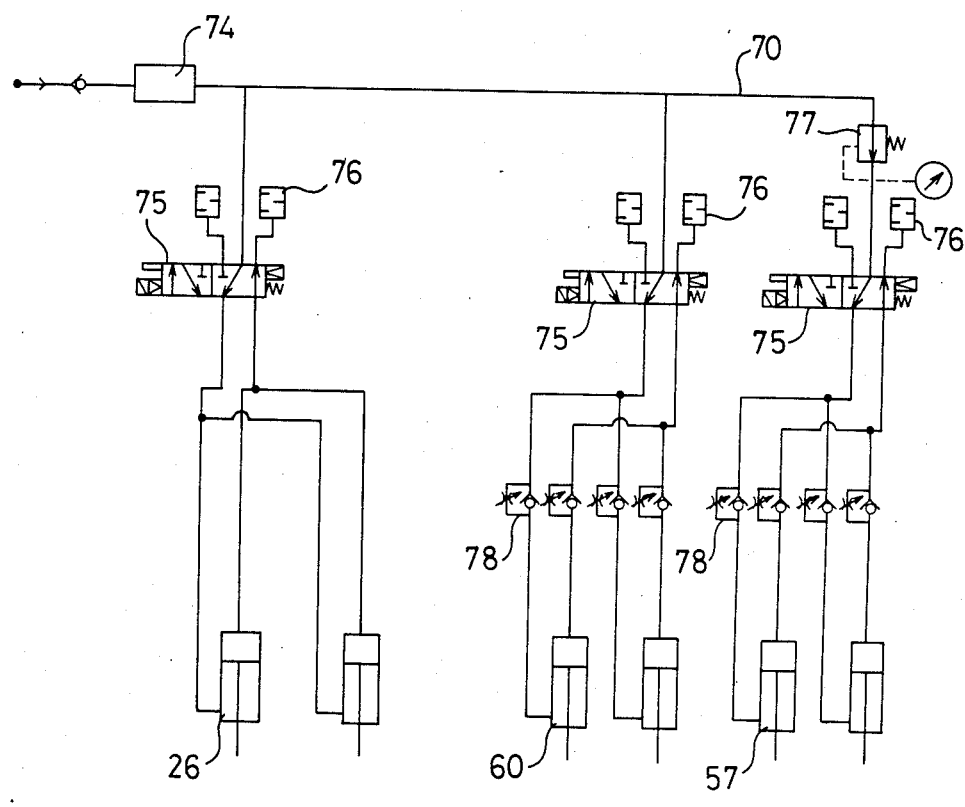
FIG. 7 is a pneumatic circuitry in a controlling mechanism for the apparatus according to the invention.

The apparatus according to the invention is provided with the controlling mechanism 70 comprising an electric, hydraulic or pneumatic circuit for controlling the vertical movement of the applying element 35 as well as the advancing, tilting, restoring and withdrawing movement of the applying element 35. As shown in FIG.7, the controlling mechanism 70 may control the supply, exhaust and interruption of pneumatic air to the cylinders 57 and 60. In FIG. 7, references 74, 75, 76, 77 and 78 represent a vacuum unit, a switch valve, a muffler, a reducing valve and a speed controller, respectively. As shown in FIG. 3, these elements may be controlled by various bottons and dials arranged on an electrically operating panel 72 and a pneumatically operating panel 73. If desired, the applying number and setting may be automatically established by selecting the combination of the elements.

The operation of the apparatus according to the invention will be described with reference to FIGS. 3 to 6. First the emulsion film 1 of a size corresponding to the screen-printing plate S is prepared. The emulsion film 1 is supported in front of the supporting plate 22 in contact therewith, while the printing face of the screen-printing plate S is contacted with the applying film 3. In this position, they are vertically supported and fixed by the clamps 26. On the other hand, the applying element 35 attached to the supporting bar 55 is filled with the penetrating agent D and is operated by various buttons and a starting switch 71 on the operating panel 72. The applying mechanism 50 operates the cylinder 57 for advancing the supporting bar 55 and the applying element 35 toward the screen face and contacting the applying element 35 at its front edge with the screen face. Thereafter, the cylinder 60 is operated to tilt the applying element 35 for pouring the penetrating agent D onto the screen face. A variable timer has been set to allow an adequate time for the penetrating agent D to penetrate into the screen M. Then, the mechanism 40 is operated to lift the unit 45 by the chain 44, thereby lifts the supporting bar 55 together with the applying element 35 while pouring the agent D onto the screen. Upon reaching the predetermined position, the applying element 35 discontinues its upward movement and the cylinder 60 is reoperated to restore the element 35 to its horizontal state. If desired, the element 35 continues its upward movement for scraping and recovering the agent D. Then, the cylinder 57 is operated to withdraw the element 35 from the screen face, while the mechanism 40 is reversely operated to lower the unit 45 and the element 35, thereby to restore its initial position.

If necessary, the applying operation may be repeated several times, the number having been set in the controlling mechanism. In this case, the applying numbers may be automatically counted. After the predetermined number is reached the applying operation may be discontinued automatically.

Thus, the penetrating agent D is applied to the squeegee side of the screen-printing plate S and penetrates through the screen M into the emulsion 3 of the emulsion film 1 to provide a suitable viscosity for causing it to adhere to the printing face of the screen material M. After applying the penetrating agent D, the supporting mechanism 20 is released to remove the screen-printing plate S and thereafter the substrate 2 of the emulsion film 1 is removed to complete the printing screen.

In accordance with the invention, the emulsion film of a predetermined thickness may be applied onto the screen face, depending on the thickness of the applying film 3 of the emulsion film 1, the applying pressure of the supplying element 35 and its speed. Furthermore the application of the emulsion is promoted by the action of the penetrating agent on the applying film 3 during the upward movement of the element 35, so that the emulsion may be adhesively applied to the screen face. By preparing the emulsion film 1 having the applying film 3 to a thickness corresponding to the thickness of the emulsion required for the screen-printing plate S, by selecting the applying pressure and speed of the squeegee 25, the supporting means 25A or 25B as well as the penetrating agent D, and by controlling the applying mechanism 40, and the operational mechanism 50 by means of the controlling mechanism 70, the emulsion of the proper thickness may be formed on the printing side of the screen-printing plate S. Furthermore, the penetrating agent D penetrates uniformly and adequately throughout the whole area of the screen face, so that a smoother emulsion membrane may be obtained.

Particularly, the supporting mechanism 20 may support the emulsion film 1 in close contact with the supporting plate 22 on the base 10, while the clamps 26 may fix the emulsion film 1 to the flat screen-printing plate, so that the emulsion film 1 may be adhesively contacted with the screen-printing plate S. When the applying element 35 is moved upward in contact with the screen face M by the lifting mechanism 40 and the operational mechanism 50, the penetrating agent D carried in the applying element 35 may penetrate through the screen M uniformly into the applying film 3 to form an even and smooth emulsion membrane on the screen-printing plate S. Furthermore, the supporting plate 22 supports the flexible emulsion film 1 securely to the screen-printing plate S and the applying element 35 moves smoothly upward, thereby improving the workability.

The applying mechanism 50 enables the applying element 35 to move toward the screen face M during its upward movement and to be contacted in its inclined position with the screen face. During the downward movement, the applying element 35 may be restored to its horizontal position and withdrawn from the screen face. Thus, the penetrating agent D may be applied only during the upward movement of the applying element 35, thereby ensuring the constant supply of the penetrating agent, the prevention of the fluid loss during the application and the smooth formation of the emulsion membrane.

As described hereinabove, in accordance with the invention, the uniform emulsion membrane of the predetermined thickness may be formed on the screen-printing plate without the conventional troublesome and complicated operation. In addition, the shaper print lines and hence excellent printings may be produced.

What is claimed is:

1. An apparatus for applying an emulsion onto a screen-printing plate comprising: a base having opposite vertical side walls on both sides for forming a frame; a supporting mechanism for supporting an emulsion film in contact with a supporting plate fixed vertically to the base and having clamps for urging the screen printing plate against the emulsion film along a front face, said emulsion film comprising a substrate and a predetermined thickness of a penetrable film of emulsion releasably coated on the substrate; a lifting mechanism for vertically moving an applying element along the screen-printing plate on a front side thereof, said applying element holding a film penetrating material; an actuating mechanism arranged at the front side of the screen-printing plate for advancing the applying element toward the screen face during upward movement of the applying element, thereby to allow a front edge of the applying element to be contacted with the screen face and to be inclined, and for restoring the applying element to a horizontal state upon a downward movement and for withdrawing the element from the screen face; and a controlling mechanism for controlling the movement of the applying element.

2. The apparatus as claimed in claim 1, wherein a mat of an elastic material is attached to the supporting plate at its front face.

3. The apparatus as claimed in claim 1, further comprising a film feeding mechanism having received therein wound emulsion film to be cut in a required length for use.

* * * * *